(12) United States Patent
Lee et al.

(10) Patent No.: US 9,666,797 B1
(45) Date of Patent: May 30, 2017

(54) MEMORY STRUCTURE HAVING MATERIAL LAYER MADE FROM A TRANSITION METAL ON INTERLAYER DIELECTRIC

(71) Applicant: MACRONIX INTERNATIONAL CO., LTD., Hsinchu (TW)

(72) Inventors: Feng-Min Lee, Hsinchu (TW); Yu-Yu Lin, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/977,770

(22) Filed: Dec. 22, 2015

(51) Int. Cl.
*H01L 45/00* (2006.01)

(52) U.S. Cl.
CPC ...... *H01L 45/1233* (2013.01); *H01L 45/1253* (2013.01); *H01L 45/146* (2013.01); *H01L 45/1633* (2013.01)

(58) Field of Classification Search
None
See application file for complete search history.

(56) References Cited

U.S. PATENT DOCUMENTS

| | | | | |
|---|---|---|---|---|
| 2009/0200640 A1* | 8/2009 | Hosoi | ............... | H01L 27/101 257/536 |
| 2009/0309088 A1* | 12/2009 | Sakamoto | ............... | H01L 27/24 257/2 |
| 2010/0155687 A1* | 6/2010 | Reyes | ............... | H01L 45/04 257/4 |
| 2010/0258781 A1* | 10/2010 | Phatak | ............... | H01L 45/1253 257/4 |
| 2012/0280199 A1* | 11/2012 | Takagi | ............... | H01L 27/101 257/3 |
| 2012/0280200 A1* | 11/2012 | Tada | ............... | H01L 45/04 257/4 |
| 2012/0326113 A1* | 12/2012 | Yoneda | ............... | G11C 13/0007 257/4 |
| 2014/0117303 A1* | 5/2014 | Wang | ............... | H01L 45/145 257/4 |

* cited by examiner

*Primary Examiner* — Kevin Parendo
(74) *Attorney, Agent, or Firm* — McClure, Qualey & Rodack, LLP

(57) ABSTRACT

A memory structure and a manufacturing method for the same are disclosed. The memory structure comprises a lower electrode, an upper insulating layer, a material layer, a dielectric film, and an upper electrode. The upper insulating layer is on the lower electrode. The material layer is on the upper insulating layer. The upper insulating layer and the material layer have a common opening to expose a portion of the lower electrode. The dielectric film is on the exposed portion of the lower electrode. The dielectric film and the material layer contain a same first transition metal. The upper electrode is on the dielectric film and fills the common opening.

12 Claims, 5 Drawing Sheets

MEMORY STRUCTURE HAVING MATERIAL LAYER MADE FROM A TRANSITION METAL ON INTERLAYER DIELECTRIC

BACKGROUND

Technical Field

The disclosure relates to a memory structure and a manufacturing method for the same, and particularly to a resistive random-access memory (ReRAM) structure and a manufacturing method for the same.

Description of the Related Art

A memory structure such as a nonvolatile semiconductor memory structure is typically designed to securely hold data even when power is lost or removed from the memory structure. Various types of nonvolatile memory structures have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

Resistive random-access memory (RRAM or ReRAM) is a non-volatile memory type. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides. It would be desirable to develop and realize a resistive memory structure with excellent electrical properties.

SUMMARY

The present disclosure relates to a memory structure and a manufacturing method for a memory structure. The memory structure has excellent operating properties.

According to an embodiment, a memory structure is disclosed. The memory structure comprises a lower electrode, an upper insulating layer, a material layer, a dielectric film, and an upper electrode. The upper insulating layer is on the lower electrode. The material layer is on the upper insulating layer. The upper insulating layer and the material layer have a common opening to expose a portion of the lower electrode. The dielectric film is on the exposed portion of lower electrode. The dielectric film and the material layer contain a same first transition metal. The upper electrode is on the dielectric film and fills the common opening.

According to another embodiment, a memory structure is disclosed. The memory structure comprises a lower electrode, memory structure and an upper electrode. The dielectric film is on the lower electrode and has a thickness of 20 to 50 angstroms. The dielectric film contains a first transition metal different from a second transition metal contained in the lower electrode. The upper electrode is on the dielectric film.

According to yet another embodiment, a method for manufacturing a memory structure is disclosed. The method comprises the following steps. An upper insulating layer is formed on a lower electrode. A material layer including a first transition metal is formed on the upper insulating layer. The material layer and the upper insulating layer are patterned to form a common opening to expose a portion of the lower electrode. A dielectric film including the first transition metal is formed by a plasma process over the exposed lower electrode exposed by using the material layer as a source of the first transition metal.

The above and other embodiments of the disclosure will become better understood with regard to the following detailed description of the non-limiting embodiment(s). The following description is made with reference to the accompanying drawings.

DETAILED DESCRIPTION

Embodiments for the present disclosure relate to a resistive memory structure and a manufacturing method thereof. According to embodiment, the resistive memory structure having a dielectric film can have excellent operating characteristics.

The illustrations may not be necessarily be drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

FIG. 1A to FIG. 1D illustrate a manufacturing method for a memory structure according to an embodiment.

Figure 1A:
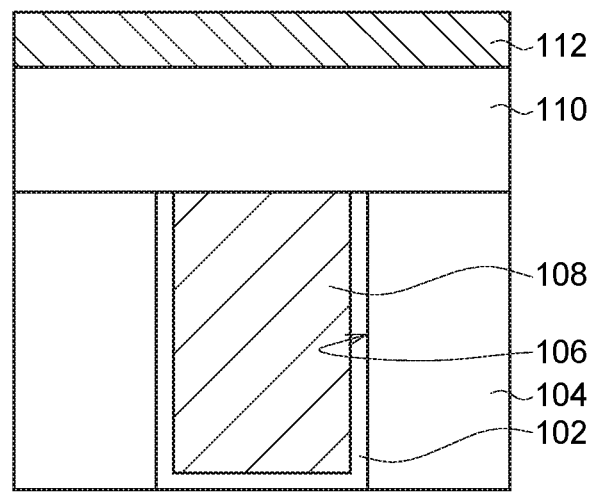
FIG. 1A to FIG. 1D illustrate a manufacturing method for a memory structure according to an embodiment.

Referring to FIG. 1A, a barrier layer 102 may be formed on a side wall and a bottom surface of a cavity 106 of a lower insulating layer 104. A lower electrode 108 may be formed on the barrier layer 102 and to fill the cavity 106. An upper insulating layer 110 may be formed on the lower insulating layer 104, the barrier layer 102 and the lower electrode 108. A material layer 112 may be formed on the upper insulating layer 110.

In embodiments, the material layer 112 contains a first transition metal, and the lower electrode 108 contains a second transition metal. The first transition metal and the second transition metal may be different from each other. The first transition metal and the second transition metal may be respectively selected from the group consisting of Ta, Hf, W and Ti. The upper insulating layer 110 and the lower insulating layer 104 may comprise a dielectric material without the first transition metal and/or the second transition metal, respectively, such as an oxide, a nitride, or an oxynitride, such as a silicon oxide (SiO, PETEOS, etc.), a silicon nitride, a silicon oxynitride, etc.

Figure 1B:
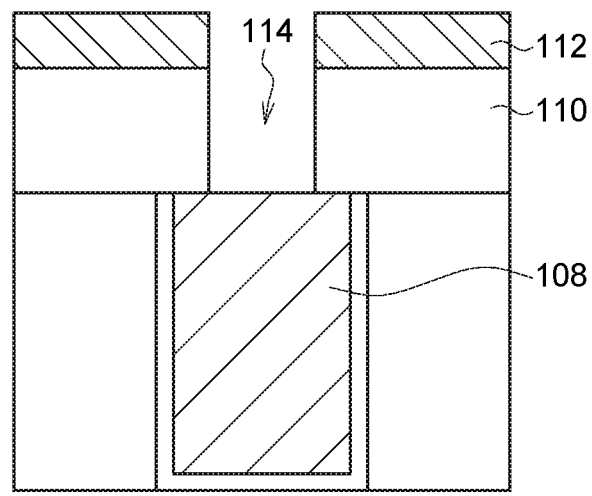

Referring to FIG. 1B, the material layer 112 and the upper insulating layer 110 are patterned to form a common opening 114 communicating the material layer 112 to the upper insulating layer 110 and exposing the lower electrode 108.

A patterning method may comprise a lithography etching process. An etching method may comprise a dry etching, a wet etching, etc.

Figure 1C:
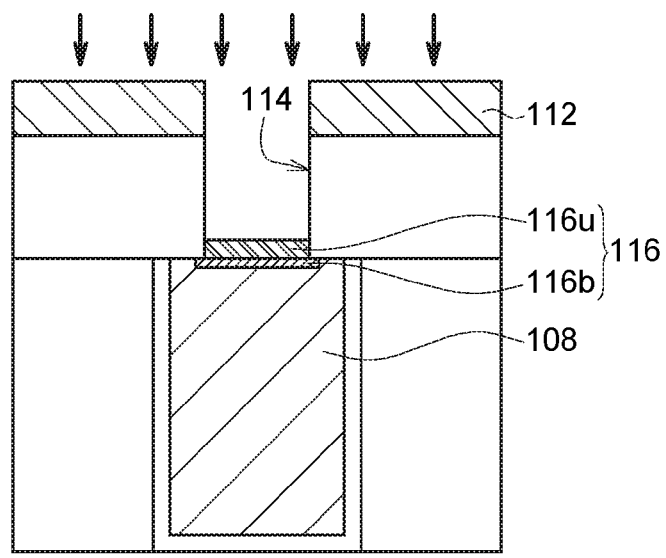

Referring to FIG. 1C, a dielectric film 116 is formed by performing a plasma process to bombard the exposed material layer 112 so that a material of the material layer 112 is transferred to deposit on the lower electrode 108 exposed by the common opening 114. Since a material of the dielectric film 116 is from at least the material layer 112 as a source, the material layer 112 and the dielectric film 116 have at least a same material, i.e. a same first transition metal.

In this case, a plasma process is performed in an oxygen containing atmosphere. This oxygen plasma treatment makes the formed dielectric film 116 comprise an oxide, such as an oxide containing the first transition metal. This plasma process using an oxygen containing gas also treats the exposed lower electrode 108 containing the second transition metal, so that an oxide of the second transition metal as a part of the dielectric film 116 is generated on a surface of the lower electrode 108. Therefore, the dielectric film 116 comprises an oxide of the first transition metal and the second transition metal.

For example, the dielectric film 116 comprises a lower dielectric layer 116*b* and an upper dielectric layer 116*u* on the lower dielectric layer 116*b*. The lower dielectric layer 116*b* is a second transition metal containing oxide formed by treating the lower electrode 108 with an oxygen plasma. The upper dielectric layer 116*u* is a first transition metal containing oxide deposited by treating the material layer 112 with the oxygen plasma. A material of the lower dielectric layer 116*b* may be different from a material of the upper dielectric layer 116*u*.

In an embodiment, the lower insulating layer 104 is a silicon oxide (SiO). The upper insulating layer 110 is a silicon oxide formed from PETEOS. The barrier layer 102 is TiN. The lower electrode 108 is W. The material layer 112 is Ti. The lower dielectric layer 116*b* is a tungsten oxide (WOx), and the upper dielectric layer 116*u* is a titanic oxide (TiOx), formed through an oxygen plasma treatment.

However, the present disclosure is not limited thereto. Any design for the double layered dielectric film 116 as a memory layer of a (resistive) memory structure formed through an oxygen plasma process may be used. For example, in an embodiment, the material layer 112 is a conductive material such as a metal of Ta, Hf, Ti, or W, as the first transition metal. Alternatively, the material layer 112 is a first transition metal containing conductive material, such as TiN etc. In an another embodiment, the material layer 112 is a first transition metal containing dielectric material of nitride or oxide, etc., such as HfO2, Ta2O5, TiO2, WO3 etc. In yet another embodiment, the material layer 112 is a silicon oxide (SiO2). In an embodiment, the lower electrode 108 is a conductive material of the second transition metal such as a metal of Ta, Hf, Ti, or W, different from the first transition metal. In another embodiment, the lower electrode 108 is a second transition metal containing conductive material, such as TiN.

The dielectric film 116 functioning as a memory layer as a memory structure may comprise TaOx, HfOx, WOx, TiOx, or SiOx, etc. For example, the dielectric film 116 having a double layered structure (upper dielectric layer 116*u*/lower dielectric layer 116*b*) may comprise designs of TaOx/WOx, HfOx/WOx, TiOx/WOx, WOx/WOy, SiOx/WOx, TiOx/TaOx, HfOx/TaOx, etc.

A plasma atmosphere may further comprise other gas, such as an inert gas, and a plasma of which would have only bombardment effect and no oxidation effect to a solid material and thus would not result in a deposited part of the dielectric film 116, according to actual demands. For example, an inert gas may comprise helium (He), neon (Ne), argon (Ar), krypton (Kr), xenon (Xe) and/or nitrogen gas, etc.

In an embodiment, a plasma process may have a power of 200 W~800 W, such as about 600 W. In an embodiment, plasma process may have an oxygen flow rate of 100 sccm~500 sccm, such as about 400 sccm. In an embodiment, a bias of the plasma process may be 100 volt~200 volt, such as about 100 volt. In an embodiment, a time of the plasma process may be 10 s~300 s, such as about 60 s. However, the present disclosure is not limited thereto. Other suitable parameters may be used according to actual process or apparatus designs.

In embodiments, the double layered dielectric film 116 formed by the plasma process would have an upper limit for a thickness of about 50 angstroms. In addition, a range of a thickness of the double layered dielectric film (a total thickness of the lower dielectric layer 116*b* and the upper dielectric layer 116*u*) is from 20 to 50 angstroms, such as 30 angstroms.

According to embodiments, characteristics for the double layered dielectric film 116 formed by the plasma process, such as a proper thickness and/or material density, and/or a void/hole density due to a plasma process parameter, would result in an improved property for a memory structure, such as a proper trade-off between a forming voltage and a breakdown voltage, or a high forming cycle, etc.

For example, the memory layer having a thickness smaller than 20 angstroms would have an advantage of low forming voltage, but also have an undesired of low breakdown voltage at the same time. Alternatively, the memory layer having a thickness bigger than 50 angstroms would have an advantage of high breakdown voltage, but also have an undesired of high forming voltage at the same time, reducing a forming cycle. In other words, a good trade-off between electrical characteristics would not be obtained due to an improper thickness range. Effects of process parameter ranges to the electrical characteristics for the memory structure are similar to the above concepts for the thickness.

Figure 1D:
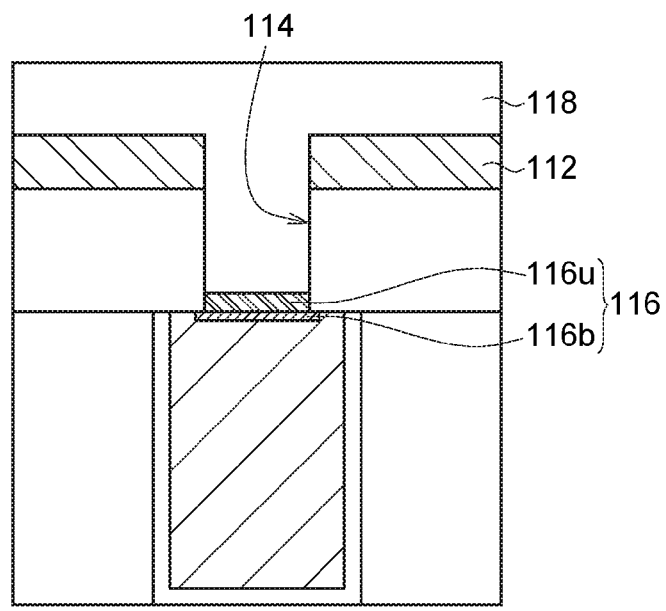

Referring to FIG. 1D, an upper electrode 118 is formed on the dielectric film 116 and fills the common opening 114. The upper electrode 118 may be extended on the material layer 112, and patterned to form a conductive routing. The upper electrode 118 may comprise gold (Au), aluminum (Al), copper (Cu), TiN, etc., or other materials having good conductivity.

Figure 2A:
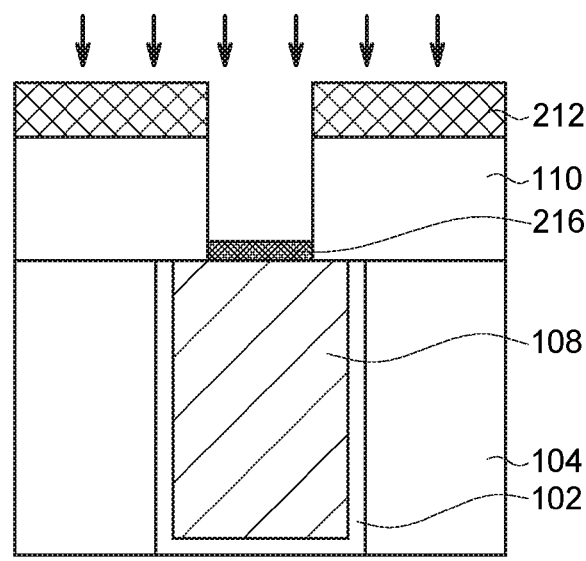
FIG. 2A to FIG. 2B illustrate a manufacturing method for a memory structure according to another embodiment.
Figure 2B:
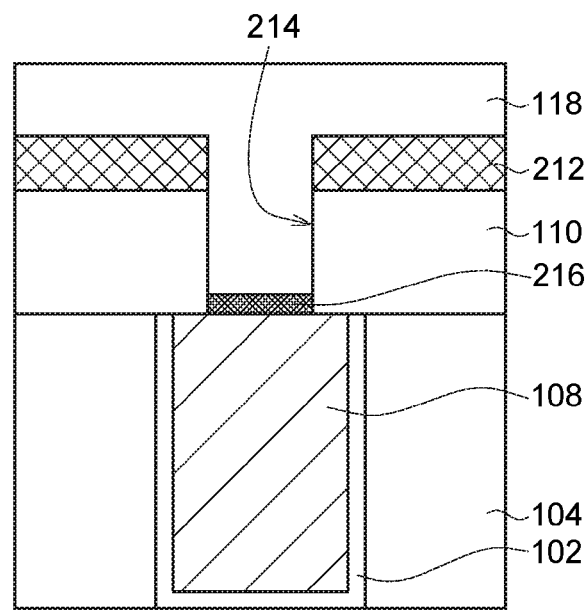

FIG. 2A to FIG. 2B illustrate a manufacturing method for a memory structure according to another embodiment, which is different from an embodiment referring to FIG. 1A to FIG. 1D in that the dielectric film is a single layered film. Elements in this embodiment are marked with the same or similar symbols with the same or similar elements in the foregoing embodiments, and the same or similar descriptions would not be illustrated in detail.

Referring to FIG. 2A, in this case, a material layer 212 is an oxide material, such as a first transition metal containing dielectric oxide, different from a material of the upper insulating layer 110, and a plasma process uses only an inert gas. Therefore, a dielectric film 216 as the memory layer is a single layered oxide containing the first transition metal formed by treating the oxide material layer 212 with the inert plasma.

In an embodiment, the lower insulating layer 104 is a silicon oxide (SiO). The upper insulating layer 110 is a silicon oxide formed from PETEOS. The barrier layer 102 is TiN. The lower electrode 108 is W. The material layer 212 is HfO2. The dielectric film 216 is a single layered film of HfOx formed through the inert plasma treatment.

However, the present disclosure is not limited thereto. Any design for the single layered dielectric film 216 as a memory layer of a (resistive) memory structure formed through an inert plasma process may be used. For example, in an embodiment, the material layer 212 comprises a first transition metal containing dielectric oxide, such as HfO2, Ta2O5, TiO2, WO3, etc. The dielectric film 216 may comprise TaOx, HfOx, WOx, TiOx, etc.

In embodiments, the single layered dielectric film 216 formed by the plasma process would have an upper limit for a thickness of about 50 angstroms. In addition, a range of a thickness of the single layered dielectric film 216 is from 20 to 50 angstroms, such as 30 angstroms.

According to embodiments, characteristics for the single layered dielectric film 216 formed by the plasma process would result in an improved property for a memory structure, such as a proper trade-off between a forming voltage and a breakdown voltage, or a high forming cycle, etc.

Referring to FIG. 2B, the upper electrode 118 is formed on the dielectric film 216 and fills a common opening 214 passing through the upper insulating layer 110 and the material layer 212.

Figure 3A:
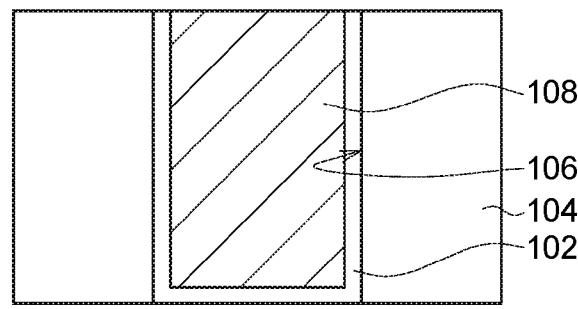
FIG. 3A to FIG. 3C illustrate a manufacturing method for a memory structure according to yet another embodiment.
Figure 3B:
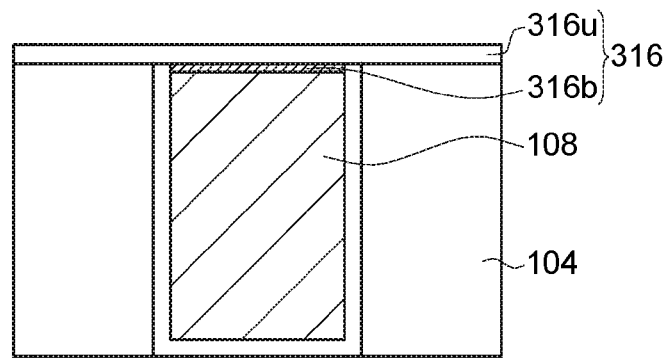
Figure 3C:
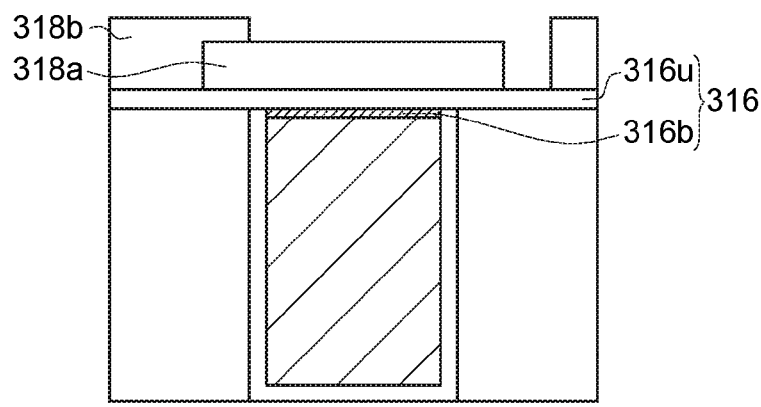

FIG. 3A to FIG. 3C illustrate a manufacturing method for a memory structure according to yet another embodiment, which is different from an embodiment referring to FIG. 1A to FIG. 1D in that an upper dielectric layer of a double layered dielectric film is deposited from a lower insulating layer as a source.

Referring to FIG. 3A, the barrier layer 102 may be formed on the side wall and the bottom surface of the cavity 106 of the lower insulating layer 104. The lower electrode 108 may be formed on the barrier layer 102 and fill the cavity 106.

Referring to FIG. 3B, an oxygen plasma process may be performed to form a dielectric film 316 comprising a lower dielectric layer 316b and an upper dielectric layer 316u. The lower dielectric layer 316b is an oxide containing the second transition metal formed by the oxygen plasma treating the surface of the lower electrode 108. The upper dielectric layer 316u is an oxide deposited from the lower insulating layer 104 as a source by the plasma treatment.

In an embodiment, the lower electrode 108 is W, and the lower dielectric layer 316b is a tungsten oxide (WOx). In addition, the lower insulating layer 104 is a silicon oxide (SiO), and the upper dielectric layer 316u is a silicon oxide (SiOx).

In embodiments, the double layered dielectric film 316 formed by the plasma process has a thickness (a total thickness of the lower dielectric layer 316b and the upper dielectric layer 316u) of 20 to 50 angstroms, and characteristics of which can improve operating properties of the memory structure.

Referring to FIG. 3C, an upper electrode 318a may be formed on the dielectric film 316. A conductive routing 318b may be formed on the upper electrode 318a. The upper electrode 318a and the conductive routing 318b may comprise Au, Al, Cu, TiN, etc., or other materials having good conductivity, respectively.

Figure 4:
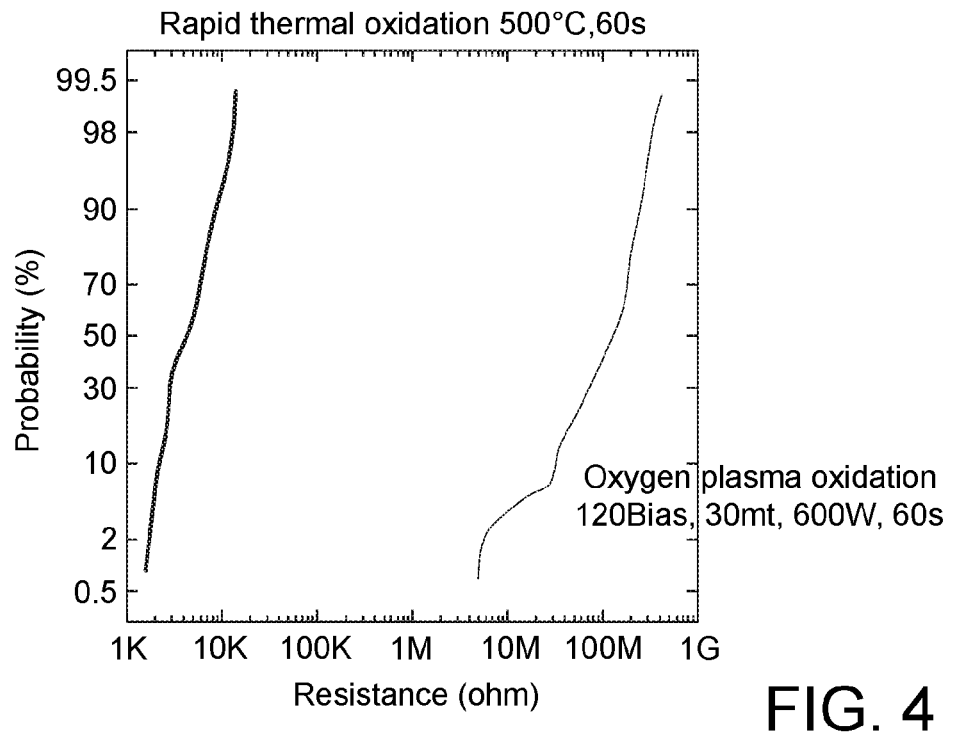
FIG. 4 and FIG. 5 show electrical characteristics of memory structures of embodiments and comparative examples.
Figure 5:
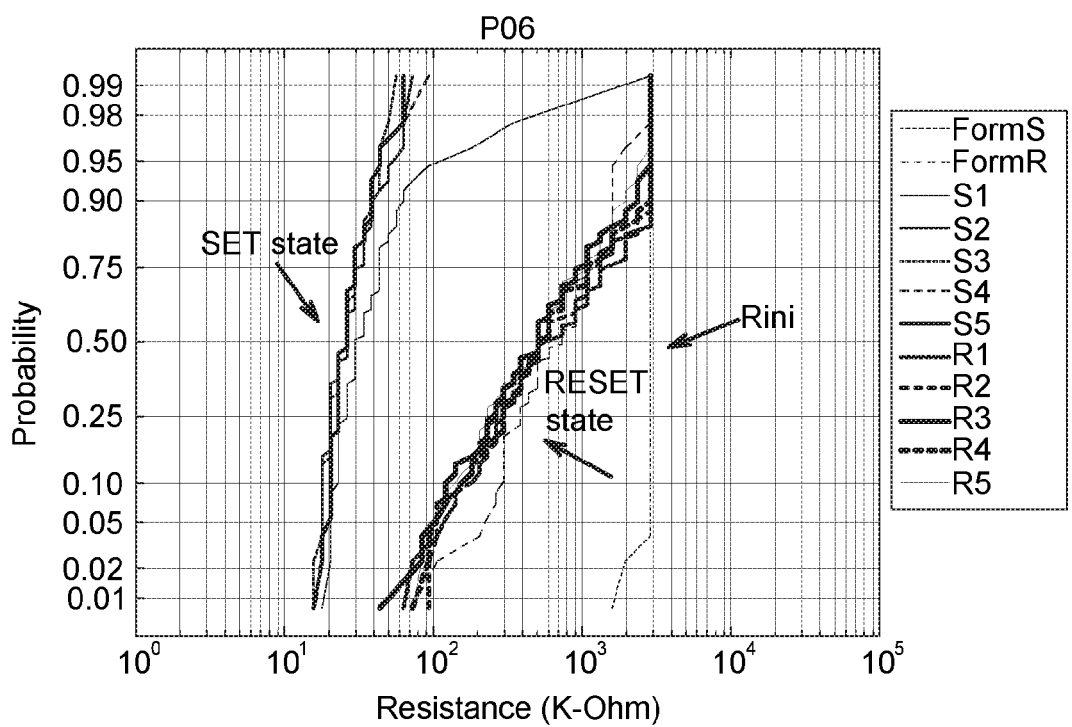

FIG. 4 and FIG. 5 show electrical characteristics of memory structures of embodiments and comparative examples. In comparative examples, a lower dielectric layer is a thick WOx film formed from a surface of a W lower electrode by a rapid thermal oxidation process (500° C., 60 s); and a material layer is not formed, thus an oxygen plasma directly treating exposed PETEOS upper insulating layer results in a SiOx upper dielectric layer adjoined on the WOx lower dielectric layer. In embodiments, a WOx lower dielectric layer and a SiOx upper dielectric layer of a double layered dielectric film, are both oxide films formed by an oxygen plasma process (120 Bias, 30 mt, 600 W, 60 s). Compared to the comparative examples, the memory structures of embodiments have higher initial resistance (Rini).

In embodiments, the lower insulating layer, the barrier layer, the lower electrode, the upper insulating layer, the material layer, the upper electrode, and conductive routing may be formed by chemical vapor deposition (CVD), physical vapor deposition (PVD), atomic layer deposition (ALD), sputtering process, or other suitable techniques.

Accordingly, in embodiments, the oxide dielectric film formed by the plasma process can contain at least the first transition metal same with that contained in the material layer, or may further contain the second transition metal same with that contained in the lower electrode. The dielectric film formed by the plasma process can have a total thickness of 20 to 50 angstroms, and have characteristics helping improving operating characteristics for the memory structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
a lower electrode;
an upper insulating layer on the lower electrode;
a material layer on a top surface of the upper insulating layer, wherein the upper insulating layer and the material layer have a common opening to expose a portion of the lower electrode;
a dielectric film on the exposed portion of the lower electrode, wherein the dielectric film and the material layer contain a same first transition metal; and
an upper electrode on the dielectric film and filling the common opening,
wherein the dielectric film comprises:
a lower dielectric layer containing a second transition metal same with a second transition metal contained in the lower electrode, wherein the second transition metal is different from the first transition metal; and
an upper dielectric layer containing the first transition metal and on the lower dielectric layer.

2. The memory structure according to claim 1, wherein the dielectric film comprises an oxide of the first transition metal.

3. The memory structure according to claim 1, wherein the dielectric film and the lower electrode contain a same second transition metal different from the first transition metal.

4. The memory structure according to claim 3, wherein the dielectric film comprises an oxide of the first transition metal and the second transition metal.

5. The memory structure according to claim 1, wherein the upper dielectric layer is an oxide of the first transition metal, the lower dielectric layer is an oxide of the second transition metal.

6. The memory structure according to claim 1, wherein a material of the lower dielectric layer is different from a material of the upper dielectric layer.

7. The memory structure according to claim 1, wherein the material layer is a conductive material as the first transition metal.

8. The memory structure according to claim 1, wherein the material layer is an oxide of the first transition metal.

9. The memory structure according to claim 1, wherein the dielectric film has a thickness of 20 to 50 angstroms.

10. The memory structure according to claim 1, wherein the material layer is a conductive material, or the material layer is a dielectric material different from the upper insulating layer.

11. The memory structure according to claim 1, further comprising a lower insulating layer, wherein the lower electrode is in the lower insulating layer.

12. The memory structure according to claim 1, wherein the upper insulating layer and the lower insulating layer comprises an oxide without the first transition metal.

\* \* \* \* \*